(12) United States Patent
Yang et al.

(10) Patent No.: US 6,592,322 B2
(45) Date of Patent: Jul. 15, 2003

(54) PERSONAL GUIDED TRANSPORT VEHICLE

(75) Inventors: Tung-Fang Yang, Yilan Hsien (TW); Cheng-Yao Lin, HsinChu Hsien (TW); Sheng-Fu Tsai, Feng Shan (TW); Tzong-Ming Wu, Taipei (TW); Muh-Wang Liang, Miaoli Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 99 days.

(21) Appl. No.: 09/987,328

(22) Filed: Nov. 14, 2001

(65) Prior Publication Data
US 2003/0049115 A1 Mar. 13, 2003

(30) Foreign Application Priority Data
Sep. 12, 2001 (TW) .......................................... 90215656

(51) Int. Cl.⁷ .............................................. B65G 49/07
(52) U.S. Cl. ........................ 414/663; 414/401; 414/940
(58) Field of Search ................................ 414/663, 401, 414/940

(56) References Cited
U.S. PATENT DOCUMENTS 5,655,869 A * 8/1997 Scheler et al. .......... 414/401 X
6,454,512 B1 * 9/2002 Weiss ......................... 414/663
6,494,671 B1 * 12/2002 Takaiti et al. ............... 414/809

FOREIGN PATENT DOCUMENTS

WO          WO 00/55074           9/2000

* cited by examiner

Primary Examiner—Steven A. Bratlie
(74) Attorney, Agent, or Firm—Rabin & Berdo, P.C.

(57) ABSTRACT

A personal guided transport vehicle is disclosed to include a horizontal motion unit, a vertical motion unit, and a gear set coupled between a shaft of the horizontal motion unit and a shaft of the vertical motion unit for enabling the shafts to be interlocked. When operating a horizontal operating lever of the horizontal motion unit, a lock pin is forced into engagement with a mounting hole of the shaft of the vertical motion unit. The horizontal motion unit and the vertical motion unit each have a spring plunger for self-lock. A docking mechanism is disclosed to enable the vehicle to be easily positioned in a docking flange. The docking mechanism includes a locating plate and a coupling plate, the locating plate having a locating notch for quick alignment, the coupling plate having hooks for hooking on the docking flange to hold the vehicle in position.

19 Claims, 8 Drawing Sheets

PERSONAL GUIDED TRANSPORT VEHICLE

BACKGROUND OF THE INVENTION

1. Field of the Invention

The present invention relates to a wafer carrier transport vehicle and, more particularly, to a PGTV (personal guided transport vehicle) to be used in an intrabay of a semiconductor fabrication to transport wafer carriers.

2. Description of Related Art

Conventionally, a variety of transport vehicles including floor track type, overhead track type, and trackless computer-controlled type wafer carrier transport vehicles are intensively used to transport wafer carriers in an intrabay of a semiconductor fabrication between a stocker and a load port. There are semiconductor fabrications using personal guided vehicles to transport wafer carriers too.

In recent years, wafers are made greater. A 12 inches wafer carrier weighs over 8 Kgs after loaded with 25 pieces of wafers. Repeatedly carring wafer carriers between the stocker and the load port (or between the load ports) with human power causes the operator to get tired or to be injured easily. In case a wafer carrier falls from the stocker or the load port accidentally during carring, the storage wafers will be damaged.

WIPO Publication #WO00/55074 discloses a PGV (personal guided vehicle). According to this design, the horizontal movement and the vertical movement are independently operated without mutual interlock. A false action may easily occur during operation, causing wafer carriers to fall from the vehicle accidentally. Another drawback of this design is that the horizontal movement and the vertical movement cannot be self-locked. Furthermore, it is difficult to keep the PGV in alignment with the docking flange, resulting in a positioning problem.

Therefore, it is desirable to provide a personal guided transport vehicle that eliminates the aforesaid drawbacks.

SUMMARY OF THE INVENTION

The main object of the present invention is to provide a personal guided transport vehicle, which assists the operator to transport wafer carriers, lowering the possibility of occupational injury and improving the manufacturing efficiency. It is another object of the present invention to provide a personal guided transport vehicle, which enables the horizontal motion unit and the vertical motion unit to be interlocked mutually, preventing a false action during operation. It is still another object of the present invention to provide a personal guided transport vehicle, which enables the horizontal motion unit and the vertical motion unit to be independently operated and respectively self-locked. It is still another object of the present invention to provide a personal guided transport vehicle, which can easily be positioned in the docking flange. According to one aspect of the present invention, the personal guided transport vehicle comprises vehicle base frame, a horizontal motion unit, a vertical motion unit, a carrier support unit, and an interlock mechanism. The vehicle base frame has a three-dimensional frame structure composed of a plurality of frame bars, a horizontal table in a middle part thereof, and a plurality of wheels at a bottom side thereof. The horizontal motion unit comprises at least one horizontal rail mounted on the horizontal table, a horizontal slide mounted on the at least one horizontal rail of the horizontal motion unit and adapted to move along the at least one horizontal rail of the horizontal motion unit, a shaft supported on the horizontal slide, and a horizontal operating lever fixedly connected to the shaft of the horizontal motion unit for operation by hand to rotate the shaft of the horizontal motion unit. The vertical motion unit comprises at least one vertical rail fixedly mounted on the horizontal slide, a vertical slide mounted on the at least one vertical rail of the vertical motion unit and adapted to move along the at least one vertical rail of the vertical motion unit, a shaft mounted on the horizontal slide, a vertical operating lever fixedly connected to the shaft of the vertical motion unit for operation by hand to rotate the shaft of the vertical motion unit, and a cam fixedly mounted on the shaft of the vertical motion unit and adapted to move the vertical slide along the at least one vertical rail of the vertical motion unit upon rotation of the shaft of the vertical motion unit. The carrier support unit comprises two horizontal forks disposed at a top side and adapted to carry a wafer carrier, and an upright support disposed at a bottom side and fixedly fastened to the vertical slide. The interlock mechanism is adapted to interlock the shaft of the horizontal motion unit and the shaft of the vertical motion unit. According to another aspect of the present invention, the vertical motion unit further comprises a coupling block fixedly mounted on the shaft thereof, the coupling block having at least one mounting hole. The interlock mechanism comprises a shaft mounted on the horizontal slide, a gear set coupled between the shaft of the horizontal motion unit and the shaft of the interlock mechanism, an actuating block concentrically fixedly mounted on the shaft of the interlock mechanism, a link, the link of the interlock mechanism having a first end eccentrically pivoted to the actuating block and a second end, and a lock pin pivoted to the second end of the link of the interlock mechanism and adapted to engage one of the at least one mounting hole of the coupling block of the vertical motion unit in order to interlock the shaft of the horizontal motion unit and the shaft of the vertical motion unit. According to still another aspect of the present invention, the personal guided transport vehicle further comprises a horizontal self-lock. The horizontal self-lock comprises a mounting block fixedly fastened to the horizontal slide around the shaft of the horizontal motion unit, the mounting block of the horizontal self-lock having at least one recessed positioning point, and a spring plunger connected in parallel to the operating lever of the horizontal motion unit at one side and adapted to engage one of the at least one recessed positioning point of the mounting block of the horizontal self-lock to lock the operation lever of the horizontal motion unit. According to still another aspect of the present invention, the personal guided transport vehicle further comprises a vertical self-lock. The vertical self-lock comprises a mounting block fixedly fastened to the horizontal slide around the shaft of the vertical motion unit, the mounting block of the vertical self-lock having at least one recessed positioning point, and a spring plunger connected in parallel to the operating lever of the vertical motion unit at one side and adapted to engage one of the at least one recessed positioning point of the mounting block of the vertical self-lock to lock the operation lever of the vertical motion unit. According to still another aspect of the present invention, the personal guided transport vehicle further comprises a docking mechanism for positioning on a docking flange. The docking mechanism comprises a pivot axle provided at a front bottom side of the vehicle base frame, a locating plate pivoted to the pivot axle, and a coupling plate pivoted to the pivot axle. The locating plate of the docking mechanism has a middle locating notch adapted to engage a locating pin at a docking flange. The locating notch has a wide front open side. The coupling plate of the docking mechanism has two forwardly extended hooks adapted to hook on a flange of the docking flange. According to still another aspect of the present invention, the vehicle base frame has horizontal guide wheels disposed at the front bottom side thereof and adapted to guide the vehicle base frame into position when loading in a load port, for enabling the docking mechanism to be positioned in the docking flange by means of the operation of a linkage.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
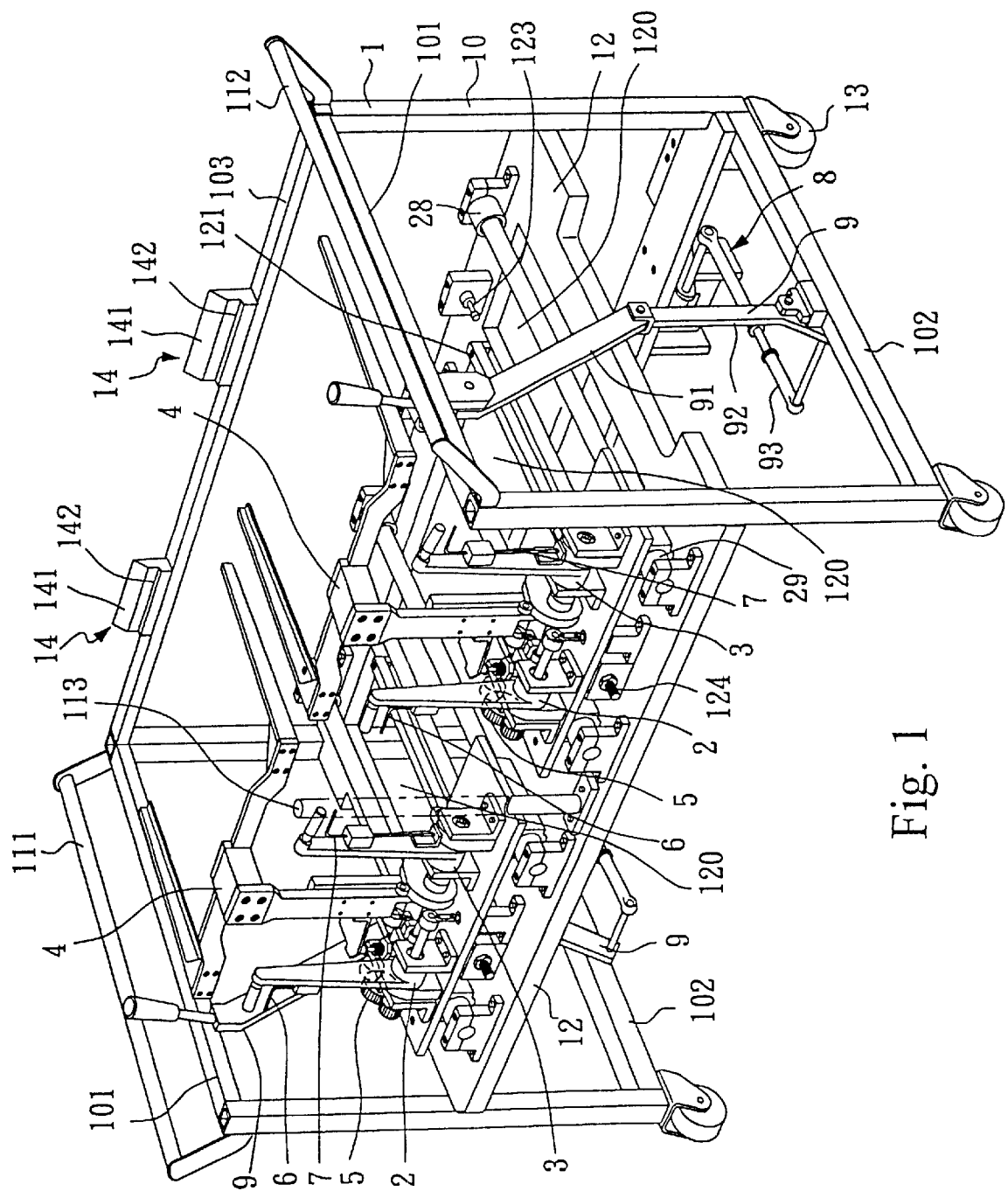
FIG. 1 is an elevational view of a personal guided transport vehicle according to the present invention.

With reference to FIG. 1, a personal guided transport vehicle in accordance with the present invention is shown having a vehicle base frame 1. The vehicle base frame 1 is a three-dimensional frame structure composed of a number of frame bars 10, having wheels 13 provided at the bottom side, and a horizontal table 12 in the middle. In order to facilitate the operation of operators, two horizontal handles 111 and 112 are provided at two opposite lateral sides of the vehicle base frame 1. Further, a vertical handle 113 extends upwardly from the horizontal table 12 near the rear side.

Two transport systems are provided and installed in the horizontal table 12 of the vehicle base frame 1, each transport system comprised of a horizontal motion unit 2, a vertical motion unit 3, a carrier support 4, an interlock mechanism 5, a horizontal self-lock 6, and a vertical self-lock 7. Alternatively, the personal guided transport vehicle can be made having one transport system for transporting only one wafer carrier, or more than two transport systems for transporting multiple wafer carriers.

Figure 2:
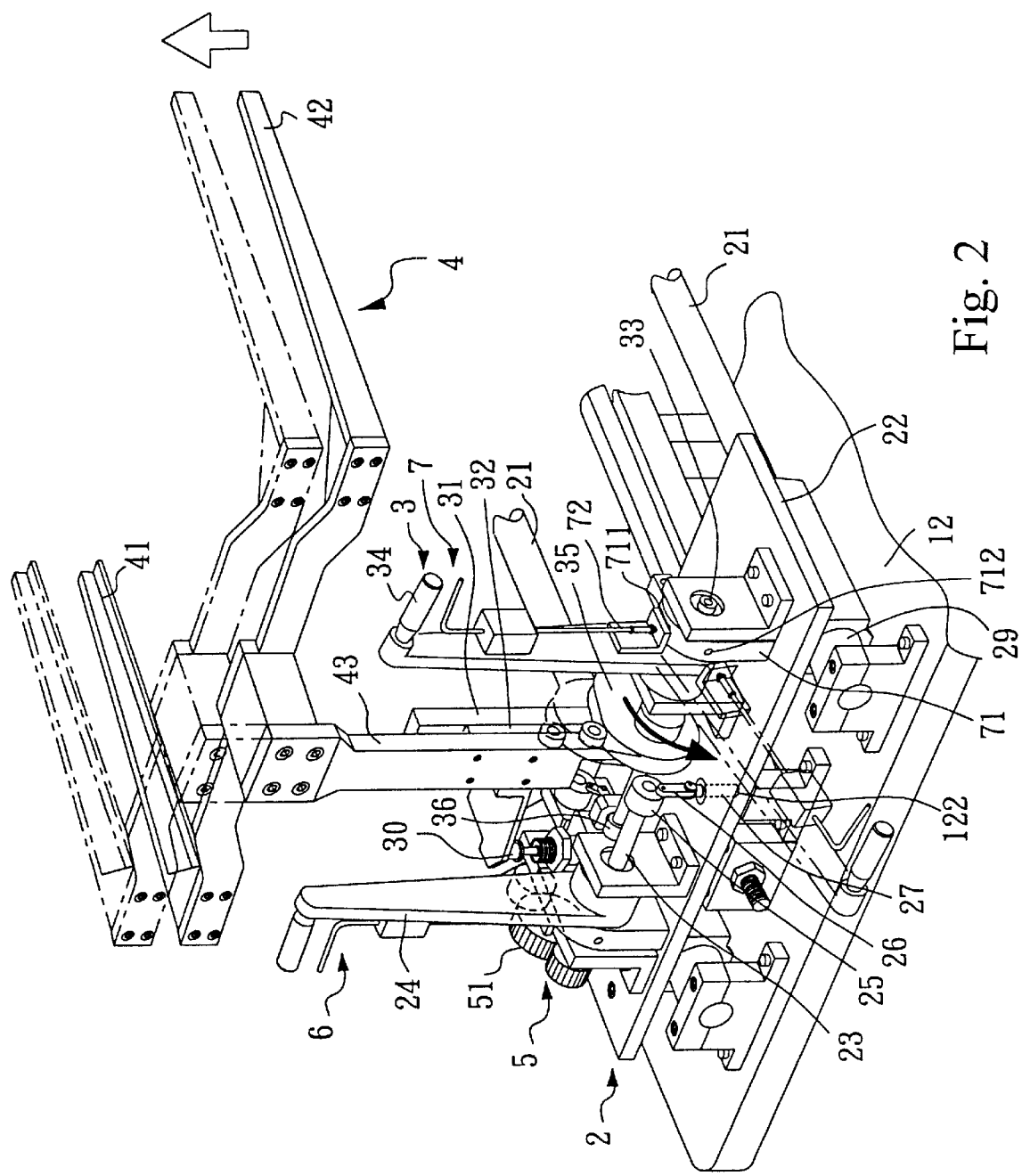
FIG. 2 is a perspective view in an enlarged scale of a part of the personal guided transport vehicle shown in FIG. 1.

Referring to FIG. 2 and FIG. 1 again, the horizontal motion unit 2 comprises two horizontal rails 21 arranged in parallel on the horizontal table 12, a horizontal slide 22 slidably mounted on the horizontal rails 21, a shaft 23 horizontally revolvably supported on the horizontal slide 22, an operating lever 24 and a coupling block 25 concentrically fixedly fastened to the shaft 23, a link 26 eccentrically coupled to the coupling block 25, and a locating pin 27 pivoted to one end of the link 26 remote from the coupling block 25. The vertical motion unit 3 comprises a vertical rail 31 fixedly fastened to the horizontal slide 22, a vertical slide 32 slidably mounted on the vertical rail 31, a shaft 33 horizontally revolvably supported on the horizontal slide 22 of the horizontal motion unit 2, and an operating lever 34, a cam 35, and a coupling block 36 concentrically fixedly fastened to the shaft 33. The carrier support unit 4 comprises two horizontal forks 41 and 42 adapted to carry a wafer carrier, and an upright support 43 fixedly fastened to the vertical slide 32, which is forced to move up and down along the vertical rail 31 by the cam 35.

Figure 3:
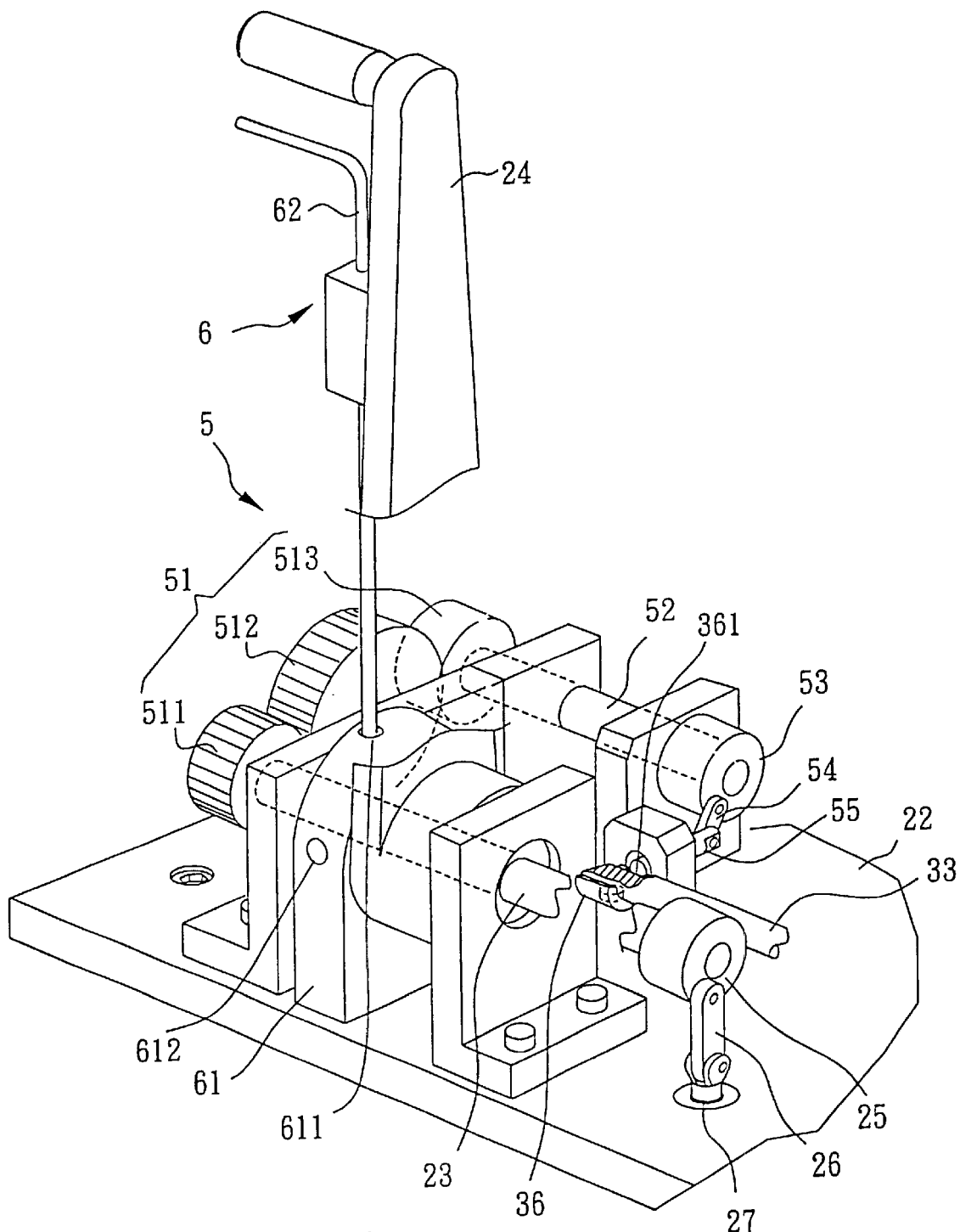
FIG. 3 is a perspective view in an enlarged scale of a part of the present invention showing the structure of the interlock mechanism.

Referring to FIG. 3, the interlock mechanism 5 comprises a gear set 51, a shaft 52, an actuating block 53, a link 54, and a lock pin 55. The shaft 52 is horizontally revolvably supported on the horizontal slide 22 of the horizontal motion unit 2. The gear set 51 comprises a first gear 511, a second gear 512, and a third gear 513. The first gear 511 is fixedly mounted on one end of the shaft 23 of the horizontal motion unit 2. The third gear 513 is fixedly mounted on one end of the shaft 52 of the interlock mechanism 5. The second gear 512 is meshed between the first gear 511 and the third gear 513, for enabling the first gear 511 and the third gear 513 to be synchronously rotated. The actuating block 53 is concentrically fixedly mounted on the shaft 52 of the interlock mechanism 5. The link 54 has one end eccentrically pivoted to the actuating block 53, and the other end pivoted to the lock pin 55.

Referring to FIG. 3 again, the horizontal self-lock 6 comprises a mounting block 61 and a spring plunger 62. The mounting block 61 is fixedly fastened to the horizontal slide 22 around the shaft 23 of the horizontal motion unit 2. The mounting block 61 has a first recessed positioning point 611 and a second recessed positioning point 612. The spring plunger 62 is connected in parallel to the operating lever 24 of the horizontal motion unit 2 at one side, having a downward prestress.

Referring to FIG. 2 again, the vertical self-lock 7 comprises a mounting block 71 and a spring plunger 72. The mounting block 71 is fixedly fastened to the horizontal slide 22 around the shaft 33 of the vertical motion unit 3. The mounting block 71 has a first recessed positioning point 711 and a second recessed positioning point 712. The spring plunger 72 is connected in parallel to the operating lever 34 of the vertical motion unit 3 at one side, having a downward prestress.

Figure 4:
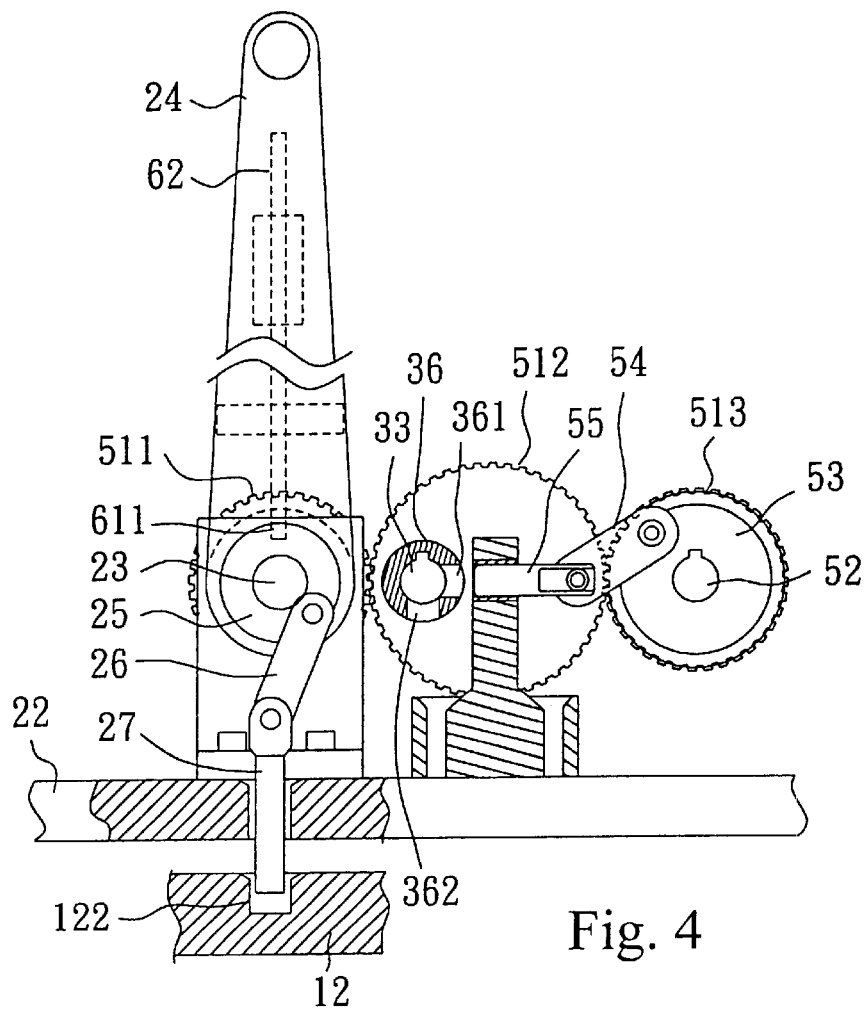
FIG. 4 is a schematic drawing showing the operation of the personal guided transport vehicle (I).

Referring to FIG. 4, during transporting the personal guided transport vehicle to the load port, the spring plunger 62 of the horizontal self-lock 6 is inserted into the first recessed positioning point 611 of the mounting block 61 of the horizontal self-lock 6 to achieve horizontal self-locking, the locating pin 27 is inserted into a rear locating hole 122 in horizontal table 12 to stop the horizontal motion unit 2 from moving, and the spring plunger 72 of the vertical self-lock 7 is inserted into the first recessed positioning point 711 of the mounting block 71 of the vertical self-lock 7 to achieve vertical self-locking (see also FIG. 2). Therefore, the whole structure of the personal guided transport vehicle is very stable during wafer carrier transportation. At this time, the lock pin 55 of the interlock mechanism 5 is not inserted into either of the mounting holes 361 and 362 of the coupling block 36 at the shaft 33 of the vertical motion unit 3.

Figure 5:
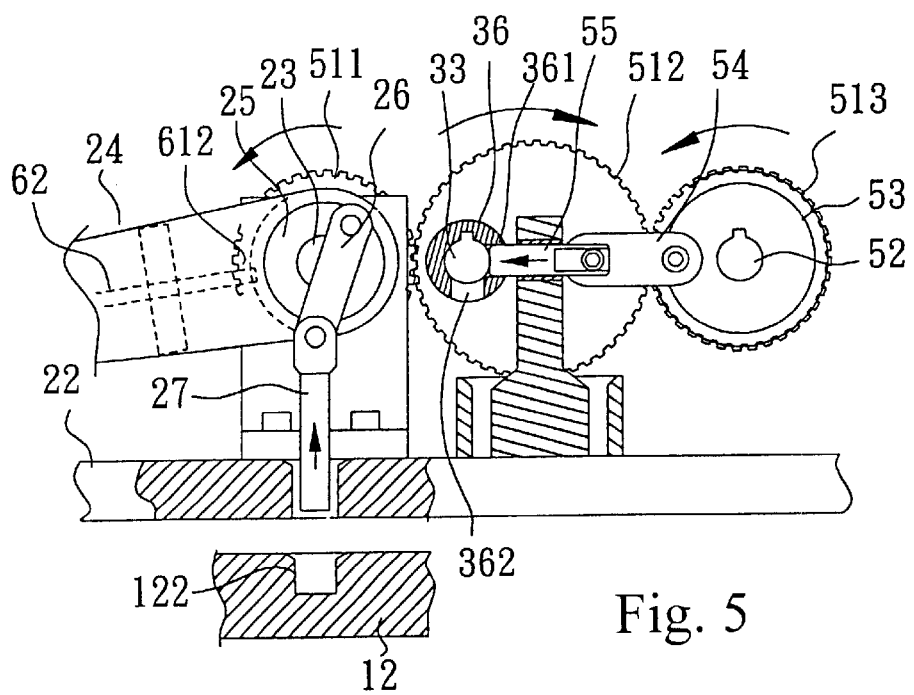
FIG. 5 is a schematic drawing showing the operation of the personal guided transport vehicle (II).

Referring to FIG. 5, when arriving at the load port and desiring to transfer the loaded wafer carrier horizontally, the operator operates the operating lever 24 of the horizontal motion unit 2 to lift the spring plunger 62 of the horizontal self-lock 6 from the first recessed positioning point 611 of the mounting block 61 of the horizontal self-lock 6, and then turns the operating lever 24 to rotate the shaft 23 and to further disconnect the locating pin 27 from the rear locating hole 122 of the horizontal table 12, and then enables the spring plunger 62 to be inserted into the second recessed positioning point 612. At the same time, the shaft 52 of the interlock mechanism 5 is rotated with the shaft 23 of the horizontal motion unit 2 by means the transmission of the gear set 51 to force the lock pin 55 of the interlock mechanism 5 into the mounting hole 361 of the coupling block 36, thereby causing the shafts 23 and 33 to be interlocked mutually. When the shafts 23 and 33 interlocked, the operating lever 34 of the vertical motion unit 3 is prohibited from operation, preventing a false action of the vertical motion unit 3 during operation of the horizontal motion.

Figure 6:
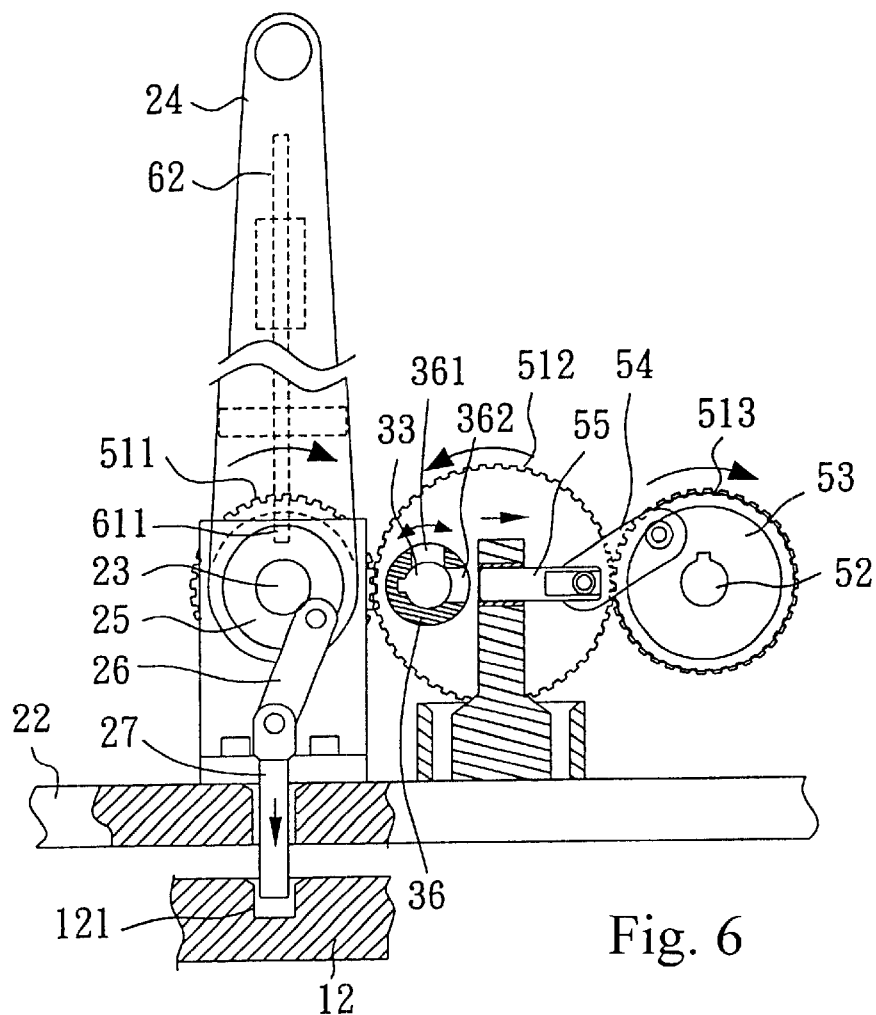
FIG. 6 is a schematic drawing showing the operation of the personal guided transport vehicle (III).

Referring to FIG. 6, when horizontally moved to the front limit position, the operator pulls the spring plunger 62 of the horizontal self-lock 6 from the second recessed positioning point 612 of the mounting block 61, and then turns the operating lever 24 to rotate the shaft 23 in the reversed direction and to further force the locating pin 27 into the front locating hole 121 of the horizontal table 12. At this time, the lock pin 55 of the interlock mechanism 5 is disengaged from the mounting hole 361 of the coupling block 36, for enabling the shaft 33 (or operating lever 34) of the vertical motion unit 3 to be freely rotated. Therefore, the operating lever 24 of the horizontal motion unit 2 is prohibited from operation, preventing a false action of the horizontal motion unit 2 during operation of the vertical motion.

Figure 7:
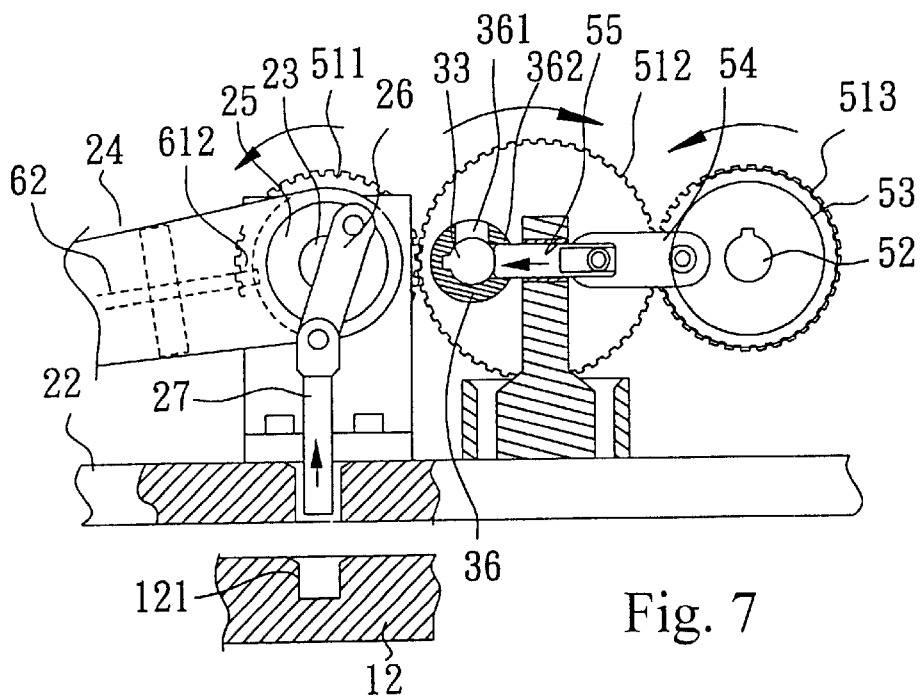
FIG. 7 is a schematic drawing showing the operation of the personal guided transport vehicle (IV).

Referring to FIG. 7, after rotation of the cam 35 (see also FIG. 2) with the shaft 33 (or operating lever 34) of the vertical motion unit 3 to lift the carrier support unit 4, the operating lever 24 of the horizontal motion unit 2 is operated again to disengage the spring plunger 27 of the horizontal motion unit 2 from the front locating hole 121, and to force the lock pin 55 of the interlock mechanism 5 into the mounting hole 362 of the coupling block 36, causing the shaft 23 and 33 interlocked again, and therefore the operating lever 34 of the vertical motion unit 3 is prohibited from rotation when next backwardly horizontal motion.

During the aforesaid operation, the vehicle base frame 1, the horizontal motion unit 2, the vertical motion unit 3, and the carrier support unit 4 assist the operator to carry wafer carriers. Therefore, the invention greatly lowers the possibility of occupational injury, and greatly improves the manufacturing efficiency of the semiconductor fabrication.

Figure 8:
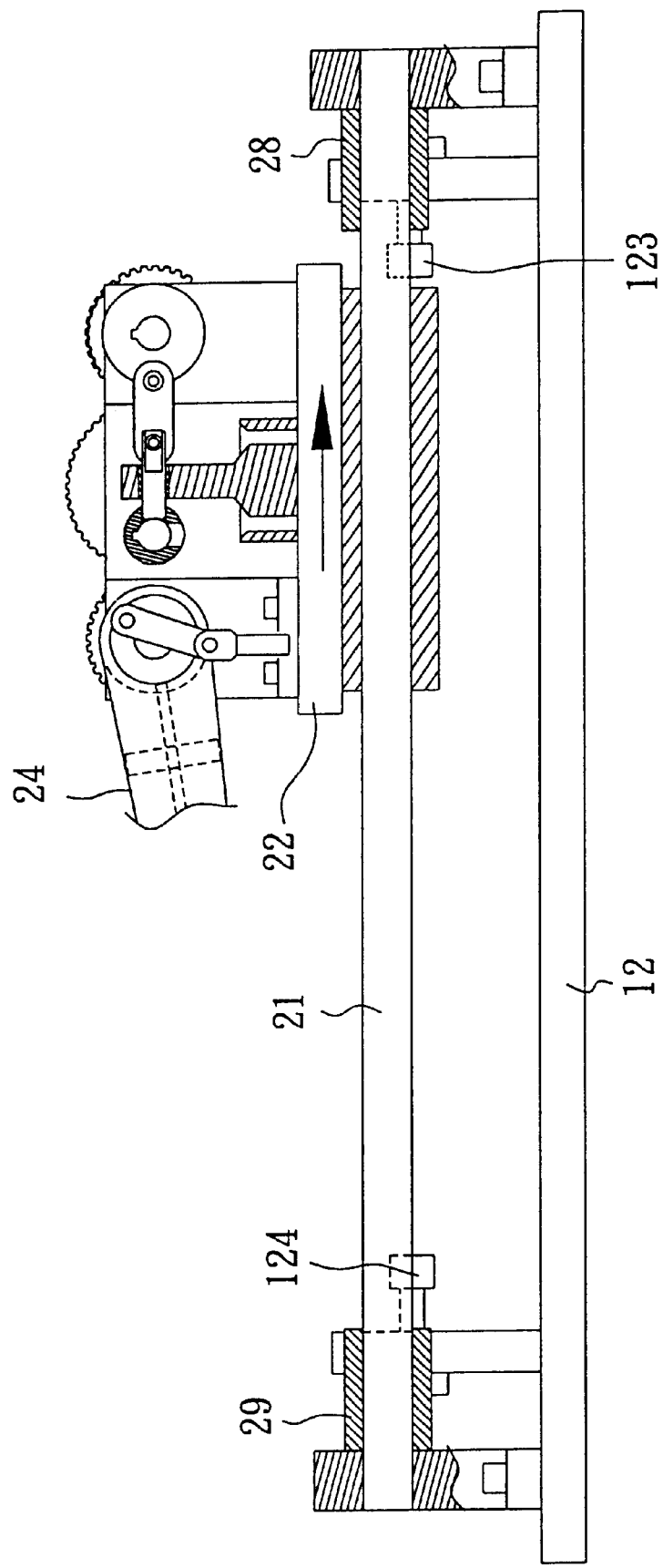
FIG. 8 is a side view in an enlarged scale of a part of the present invention.

Referring to FIG. 8, horizontal damping device (for example, hydraulic shock absorbers) 123 and 124 are provided at the front and rear sides of the horizontal table 12, and adapted to stop the horizontal slide 22 in the front or rear limit position. Two cushion blocks (for example, polyurethane collars) 28 and 29 are respectively fixedly mounted on the two distal ends of each horizontal rail 21 of the horizontal motion unit 2 and adapted to sustain shock from the horizontal slide 22 when the horizontal slide 22 moved to the front or rear limit position. A vertical damping device 30 may be provided to sustain shock from the carrier support unit 4 (see FIG. 2).

Figure 9:
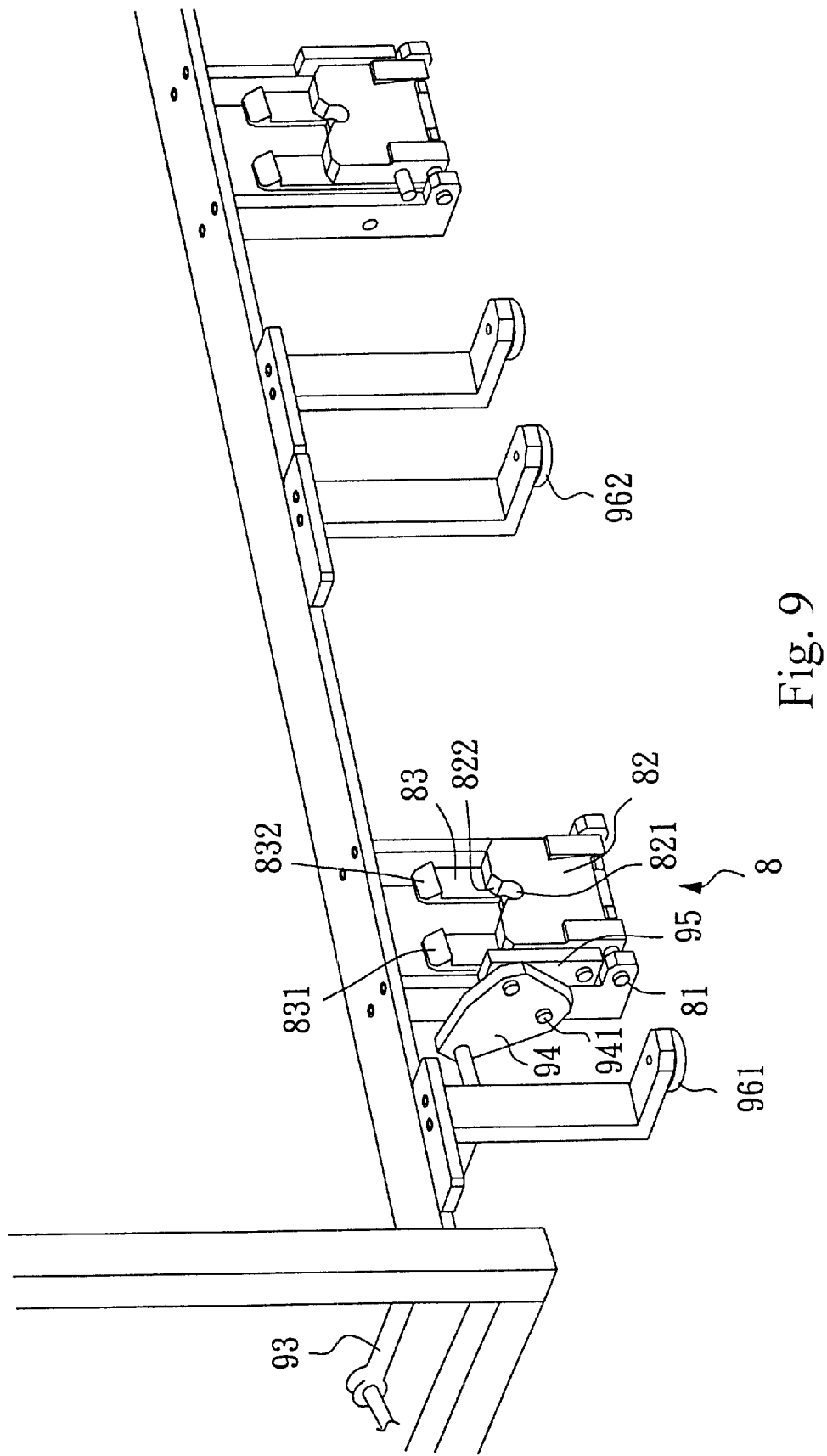
FIG. 9 is a perspective view in an enlarged scale of a part of the present invention showing the structure of the docking mechanism.

Referring to FIG. 9, a docking mechanism 8 is pivoted to the front bottom side of the vehicle base frame 1 by a pivot axle 81. The docking mechanism 8 is comprised of a locating plate 82, and a coupling plate 83. The locating plate 82 and the coupling plate 83 are coaxially pivoted to the pivot axle 81. The locating plate 82 has a locating notch 821 on the middle. The locating notch 821 has a wide front open side 822. The coupling plate 83 is lapped on the locating plate 82, having two forwardly extended hooks 831 and 832. A linkage 9 is provided and operated to turn the docking mechanism 8 about the pivot axle 81 forwardly or backwardly between an extended position and a retracted position.

Figure 10:
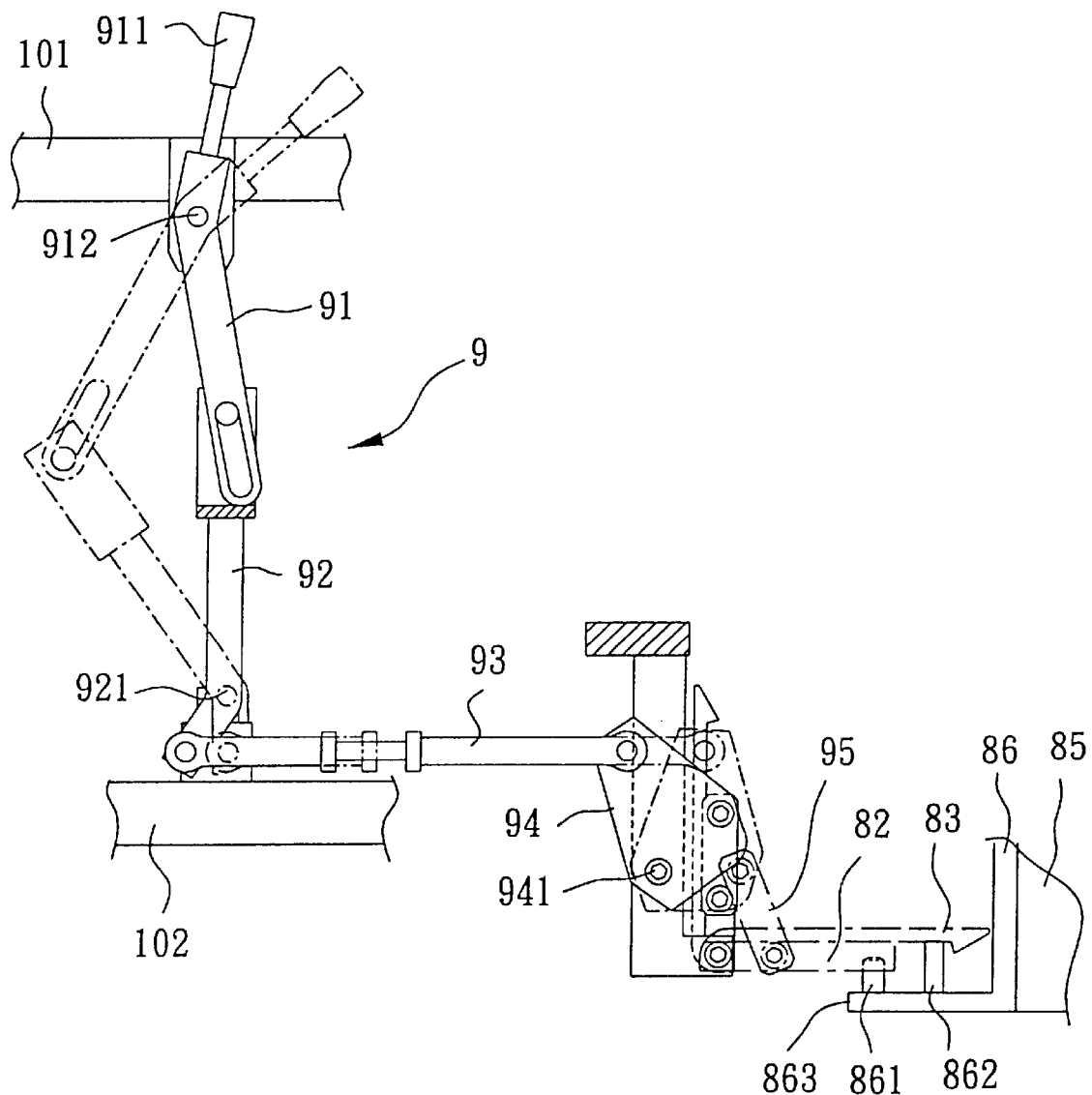
FIG. 10 is a perspective view in an enlarged scale of a part of the present invention showing the structure of the linkage.

Referring to FIG. 10 and FIG. 1 again, the linkage 9 is comprised of a first link 91, a second link 92, a third link 93, a fourth link 94, and a fifth link 95. The links 91~95 are pivoted to one another in a series. The first link 91 has a middle part pivoted to a pivot 912 at one horizontal side top frame bar 101 of the vehicle base frame 1. The second link 92 has a middle part pivoted to a pivot 921 at one horizontal side bottom frame bar 102 of the vehicle base frame 1. The fourth link 94 has a middle part pivoted to a pivot 941 at the front bottom side of the vehicle base frame 1. The fifth link 95 is pivoted to the locating plate 82 at one end remote from the forth link 94.

When the operator pushed the personal guided transport vehicle to the front side of the load port 85, front bottom horizontal guide wheels 961 and 962 of the vehicle base frame 1 are rolled and stopped at the front edge 863 of the docking flange 86. Thereafter, the operator operates a top handle 911 to turn the first link 91 about the pivot 912, thereby causing the second link 92 to be turned about the pivot 921 to further drive the third link 93 to turn the fourth link 94 about the pivot 941, and therefore the fifth link 95 turns the locating plate 82 and coupling plate 83 of the docking mechanism 8 about the pivot axle 81 forwardly to the extended position. Because the locating notch 821 of the locating plate 82 has a wide front open side 822, the locating notch 821 can easily be aimed and forced into engagement with a locating pin 861 at the docking flange 86. A pushing motion forces the hooks 831 and 832 of the coupling plate 83 to cross over and hook on the flange 862 of the docking flange 86.

The horizontal table 12 of the vehicle base frame 1 has a plurality of view holes 120 (see FIG. 1). Through the view holes 120, the operator can easily see the locating pin 861 at the docking flange 86 (see FIG. 10), and the locating notch 821 with its wide front open side 822 (see FIG. 9) so that the docking mechanism 8 can easily be positioned in the docking flange 86.

Furthermore, two guard blocks 14 (see FIG. 1) are provided at the horizontal front top frame bar 103 of the vehicle base frame 1. The guard blocks 14 each have a beveled face 141 adapted to guide the corresponding wafer carrier into position, preventing the wafer carrier from falling down. Each guard block 14 further has a bearing portion 142 adapted to support the corresponding wafer carrier on the carrier support unit 4.

Although the present invention has been explained in relation to its preferred embodiments, it is to be understood that many other possible modifications and variations can be made without departing from the spirit and scope of the invention as hereinafter claimed.

What is claimed is:

1. A personal guided transport vehicle comprising:
   a vehicle base frame, said vehicle base frame having a three-dimensional frame structure composed of a plurality of frame bars, a horizontal table in a middle part thereof, and a plurality of wheels at a bottom side thereof;

a horizontal motion unit, said horizontal motion unit comprising at least one horizontal rail mounted on said horizontal table, a horizontal slide mounted on the at least one horizontal rail of said horizontal motion unit and adapted to move along the at least one horizontal rail of said horizontal motion unit, a shaft supported on said horizontal slide, and a horizontal operating lever fixedly connected to the shaft of said horizontal motion unit for operation by hand to rotate the shaft of said horizontal motion unit;

a vertical motion unit, said vertical motion unit comprising at least one vertical rail fixedly mounted on said horizontal slide, a vertical slide mounted on the at least one vertical rail of said vertical motion unit and adapted to move along the at least one vertical rail of said vertical motion unit, a shaft mounted on said horizontal slide, a vertical operating lever fixedly connected to the shaft of said vertical motion unit for operation by hand to rotate the shaft of said vertical motion unit, and a cam fixedly mounted on the shaft of said vertical motion unit and adapted to move said vertical slide along the at least one vertical rail of said vertical motion unit upon rotation of the shaft of said vertical motion unit;

a carrier support unit, said carrier support unit comprising two horizontal forks disposed at a top side and adapted to carry a wafer carrier, and an upright support disposed at a bottom side and fixedly fastened to said vertical slide; and an interlock mechanism adapted to interlock the shaft of said horizontal motion unit and the shaft of said vertical motion unit.

2. The personal guided transport vehicle as claimed in claim 1 wherein said vertical motion unit further comprises a coupling block fixedly mounted on the shaft thereof, said coupling block having at least one mounting hole.

3. The personal guided transport vehicle as claimed in claim 1, wherein said interlock mechanism comprises a shaft mounted on said horizontal slide of said horizontal motion unit, a gear set coupled between the shaft of said horizontal motion unit and the shaft of said interlock mechanism, an actuating block concentrically fixedly mounted on the shaft of said interlock mechanism, a link, the link of said interlock mechanism having a first end eccentrically pivoted to said actuating block and a second end, and a lock pin pivoted to the second end of the link of said interlock mechanism and adapted to engage one of the at least one mounting hole of said coupling block of said vertical motion unit in order to interlock the shaft of said horizontal motion unit and the shaft of said vertical motion unit.

4. The personal guided transport vehicle as claimed in claim 3, wherein said gear set of said interlock mechanism comprises a first gear, a second gear, and a third gear, said first gear being fixedly mounted on one end of the shaft of said horizontal motion unit, said third gear being fixedly mounted on one end of the shaft of said interlock mechanism, said second gear being meshed between said first gear and said third gear.

5. The personal guided transport vehicle as claimed in claim 1, wherein said horizontal table of said vehicle base frame has at least one locating hole.

6. The personal guided transport vehicle as claimed in claim 5, wherein said horizontal motion unit further comprises a coupling block fixedly mounted on the shaft thereof, a link eccentrically pivoted to the coupling block of said horizontal motion unit, and a locating pin pivoted to one end of said link remote from the coupling block of said horizontal motion unit and adapted to engage one of the at least one locating hole of said horizontal table of said vehicle base frame to stop said horizontal motion unit from movement.

7. The personal guided transport vehicle as claimed in claim 1 further comprising a horizontal self-lock, said horizontal self-lock comprising a mounting block fixedly fastened to said horizontal slide around the shaft of said horizontal motion unit, the mounting block of said horizontal self-lock having at least one recessed positioning point, and a spring plunger connected in parallel to the operating lever of said horizontal motion unit at one side and adapted to engage one of the at least one recessed positioning point of the mounting block of said horizontal self-lock to lock the operating lever of said horizontal motion unit.

8. The personal guided transport vehicle as claimed in claim 1 further comprising a vertical self-lock, said vertical self-lock comprising a mounting block fixedly fastened to said horizontal slide around the shaft of said vertical motion unit, the mounting block of said vertical self-lock having at least one recessed positioning point, and a spring plunger connected in parallel to the operating lever of said vertical motion unit at one side and adapted to engage one of the at least one recessed positioning point of the mounting block of said vertical self-lock to lock the operation lever of said vertical motion unit.

9. The personal guided transport vehicle as claimed in claim 1, wherein said vehicle base frame comprises two horizontal handles at two opposite lateral sides thereof.

10. The personal guided transport vehicle as claimed in claim 1 wherein said vehicle base frame comprises a vertical handle extended upwardly from a rear side of said horizontal table.

11. The personal guided transport vehicle as claimed in claim 1 further comprising a docking mechanism for positioning on a docking flange, said docking mechanism comprising a pivot axle provided at a front bottom side of said vehicle base frame, a locating plate pivoted to said pivot axle, and a coupling plate pivoted to said pivot axle, the locating plate of said docking mechanism having a middle locating notch, the coupling plate of said docking mechanism having two forwardly extended hooks.

12. The personal guided transport vehicle as claimed in claim 11 wherein said locating notch has a wide front open side.

13. The personal guided transport vehicle as claimed in claim 11 further comprising a linkage adapted to turn said docking mechanism about said pivot axle forwardly/backwardly between an extended position and a retracted position.

14. The personal guided transport vehicle as claimed in claim 13 wherein said linkage comprising a first link, a second link, a third link, a fourth link, and a fifth link respectively pivoted to one another in a series, said first link having a top end fixedly mounted with a handle, a middle part pivoted to a pivot at one horizontal side top frame bar of said vehicle base frame, said second link having a middle part pivoted to a pivot at one horizontal side bottom frame bar of said vehicle base frame, said fourth link having a middle part pivoted to a pivot at a front bottom side of said vehicle base frame, said fifth link pivoted to the locating plat of said docking mechanism at one end remote from the forth link.

15. The personal guided transport vehicle as claimed in claim 1 wherein said horizontal table of said vehicle base frame has at least one view hole aimed at a docking mechanism.

16. The personal guided transport vehicle as claimed in claim 1, wherein said vehicle base frame further comprises at least two horizontal guide wheels disposed at a front bottom side thereof and adapted to guide said vehicle base frame into a docking flange.

17. The personal guided transport vehicle as claimed in claim 1, wherein said vehicle base frame further comprises at least one guard block disposed at a front top side thereof and adapted to stop a loaded wafer carrier in position.

18. The personal guided transport vehicle as claimed in claim 17, wherein said at least one guard block each has a beveled face adapted to guide a loading wafer carrier into position.

19. The personal guided transport vehicle as claimed in claim 17, wherein said at least one guard block each has a bearing portion adapted to support a wafer carrier.

* * * * *